(12) United States Patent
Kato et al.

(10) Patent No.: US 10,425,062 B2
(45) Date of Patent: Sep. 24, 2019

(54) POLYPHASE FILTER AND FILTER CIRCUIT

(71) Applicant: MITSUBISHI ELECTRIC CORPORATION, Tokyo (JP)

(72) Inventors: Atsushi Kato, Tokyo (JP); Eiji Taniguchi, Tokyo (JP); Takaya Maruyama, Tokyo (JP); Takanobu Fujiwara, Tokyo (JP); Koji Tsutsumi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/067,701

(22) PCT Filed: Feb. 17, 2016

(86) PCT No.: PCT/JP2016/054514
§ 371 (c)(1),
(2) Date: Jul. 2, 2018

(87) PCT Pub. No.: WO2017/141367
PCT Pub. Date: Aug. 24, 2017

(65) Prior Publication Data
US 2019/0013794 A1  Jan. 10, 2019

(51) Int. Cl.
*H03H 7/00* (2006.01)
*H03H 11/12* (2006.01)
(Continued)

(52) U.S. Cl.
CPC .............. *H03H 11/12* (2013.01); *H03H 7/21* (2013.01); *H03H 11/22* (2013.01); *H03H 11/20* (2013.01);
(Continued)

(58) Field of Classification Search
CPC .......... H03H 11/12; H03H 7/21; H03H 11/22; H03H 11/20; H03H 2007/0192; H03H 2210/021; H03H 2210/025
(Continued)

(56) References Cited

U.S. PATENT DOCUMENTS 8,797,111 B2 *  8/2014  Oishi ....................... H03H 7/21
                                                        327/552
9,559,792 B1 *  1/2017  Amir-Aslanzadeh ........................
                                                         H04B 17/12
(Continued)

FOREIGN PATENT DOCUMENTS

JP       2001-045080 A       2/2001

OTHER PUBLICATIONS

Kodama et al., "A 1.3-degree I/Q Phase Error, 7.1-8.7-GHz LO Generator with Single-Stage Digital Tuning Polyphase Filter", 2010 Symposium on VLSI Circuits/Technical Digest of Technical Papers, 2010, pp. 145-146.

*Primary Examiner* — Ryan Jager
(74) *Attorney, Agent, or Firm* — Birch, Stewart, Kolasch & Birch, LLP

(57) ABSTRACT

Provided is a polyphase filter, which is capable of achieving amplitude matching and phase matching while achieving a low insertion loss with a single-stage configuration. A first variable resistor and a second variable resistor have resistance values that are equal to each other, and the resistance values are set so as to correct an amplitude error between orthogonal signals of outputs of a first output terminal to a fourth output terminal. A first variable capacitor, a second variable capacitor, a third variable capacitor, and a fourth variable capacitor have capacitance values that are equal to one another, and the capacitance values are set so as to correct a phase error between the orthogonal signals of the
(Continued)

outputs of the first output terminal to the fourth output terminal.

3 Claims, 6 Drawing Sheets

(51) Int. Cl.
    *H03H 11/22*     (2006.01)
    *H03H 7/21*     (2006.01)
    *H03H 11/20*     (2006.01)
    *H03H 7/01*     (2006.01)

(52) U.S. Cl.
    CPC .............. *H03H 2007/0192* (2013.01); *H03H 2210/021* (2013.01); *H03H 2210/025* (2013.01)

(58) Field of Classification Search
    USPC ........................................................ 327/553
    See application file for complete search history.

(56) References Cited

U.S. PATENT DOCUMENTS

| | | | |
|---|---|---|---|
| 2004/0116096 A1* | 6/2004 | Shen | H04B 1/28 455/323 |
| 2005/0245225 A1* | 11/2005 | Park | H03D 7/165 455/313 |
| 2006/0246861 A1* | 11/2006 | Dosanjh | H03B 21/00 455/147 |
| 2010/0178890 A1* | 7/2010 | Fujii | H03H 7/20 455/209 |
| 2011/0068843 A1* | 3/2011 | Kodama | H03H 7/0153 327/238 |

\* cited by examiner

POLYPHASE FILTER AND FILTER CIRCUIT

TECHNICAL FIELD

The present invention relates to a polyphase filter, which is configured to generate I/Q orthogonal signals, and a filter circuit using the polyphase filter.

BACKGROUND ART

Heretofore, as an I/Q orthogonal signal generator used for an image rejection mixer (IRM) or a vector sum phase shifter, there has been known a polyphase filter. The polyphase filter, which includes resistors and capacitors, has a function of generating I/Q orthogonal signals inside the vector sum phase shifter, and is required to have a low insertion loss, and high amplitude accuracy and phase accuracy. In general, in order to improve the phase accuracy, a method of using a polyphase filter having a multi-stage configuration is adopted, but the method has a problem of an increased insertion loss.

As such polyphase filter, there has been proposed an amplitude matching type polyphase filter, which is configured to set resistance values and capacitance values so as to correct an amplitude error to be output. Further, there has been proposed a polyphase filter in which an amplitude matching type polyphase filter and a multi-stage polyphase filter are combined to achieve amplitude matching and phase matching (see Patent Literature 1, for example).

Moreover, in order to improve the phase accuracy without using the polyphase filter having the multi-stage configuration, there has been proposed a polyphase filter that uses varactors, which are variable capacitors, as capacitors to achieve high phase accuracy (see Non Patent Literature 1, for example).

CITATION LIST

Patent Literature

[PTL 1] JP 2001-45080 A

Non Patent Literature

[NPL 1] H. Kodama et al "A 1.3-degree I/Q Phase Error, 7.1-8.7-GHz LO Generator with Single-Stage Digital Tuning Polyphase Filter" 2010 Symposium on VLSI Circuits/Technical Digest of Technical Papers pp. 145-146

SUMMARY OF INVENTION

Technical Problem

However, the related art has the following problems.

Specifically, Patent Literature 1 has a problem in that, with the amplitude matching type polyphase filter being formed by combining variable resistors and fixed capacitors, although the amplitude error can be corrected by adjusting resistance values of the variable resistors, a phase error cannot be corrected. Moreover, when the amplitude matching type polyphase filter is combined with the multi-stage polyphase filter in order to correct the phase error, there is the problem of the increased insertion loss as described above.

Moreover, in Non Patent Literature 1, the polyphase filter is formed by combining fixed resistors and the varactors, and hence a phase error can be corrected by adjusting capacitance values of the varactors. However, the varactors have a characteristic of a reduced Q value especially in a high-frequency range. Therefore, in the high-frequency range, there apparently occurs a condition equivalent to a configuration in which a series resistor is connected to the varactor, and hence there is a problem in that an amplitude error may occur between orthogonal signals to be output.

Moreover, it can be considered to correct the amplitude error and the phase error by combining the polyphase filter of Patent Literature 1 and the polyphase filter of Non Patent Literature 1. However, this results in a polyphase filter having a two-stage configuration, and hence there is the problem of the increased insertion loss as described above.

The present invention has been made to solve the above-mentioned problems, and therefore has an object to provide a polyphase filter, which is capable of achieving amplitude matching and phase matching while achieving a low insertion loss with a single-stage configuration.

Solution to Problem

According to one embodiment of the present invention, there is provided a polyphase filter including: a first fixed resistor, which has one end connected to a first input terminal, and another end connected to a first output terminal; a first variable resistor, which has one end connected to the first input terminal, and another end connected to a second output terminal; a second fixed resistor, which has one end connected to a second input terminal, and another end connected to a third output terminal; a second variable resistor, which has one end connected to the second input terminal, and another end connected to a fourth output terminal; a first variable capacitor, which has one end connected to the second input terminal, and another end connected to the first output terminal; a second variable capacitor, which has one end connected to the first input terminal, and another end connected to the second output terminal; a third variable capacitor, which has one end connected to the first input terminal, and another end connected to the third output terminal; and a fourth variable capacitor, which has one end connected to the second input terminal, and another end connected to the fourth output terminal. The first variable resistor and the second variable resistor have resistance values that are equal to each other, the resistance values being set so as to correct an amplitude error between orthogonal signals of outputs of the first output terminal to the fourth output terminal. The first variable capacitor, the second variable capacitor, the third variable capacitor, and the fourth variable capacitor have capacitance values that are equal to one another, the capacitance values being set so as to correct a phase error between the orthogonal signals of the outputs of the first output terminal to the fourth output terminal.

Advantageous Effects of Invention

According to the polyphase filter of the present invention, the first variable resistor and the second variable resistor have the resistance values that are equal to each other, and the resistance values are set so as to correct the amplitude error between the orthogonal signals of the outputs of the first output terminal to the fourth output terminal. Moreover, the first variable capacitor, the second variable capacitor, the third variable capacitor, and the fourth variable capacitor have the capacitance values that are equal to one another, and the capacitance values are set so as to correct the phase error between the orthogonal signals of the outputs of the first output terminal to the fourth output terminal.

Therefore, amplitude matching and phase matching can be achieved while achieving the low insertion loss with the single-stage configuration.

DESCRIPTION OF EMBODIMENTS

A description is now given of a polyphase filter and a filter circuit according to preferred embodiments of the present invention with reference to the drawings, and throughout the drawings, like or corresponding components are denoted by like reference symbols to describe those components.

Figure 1:
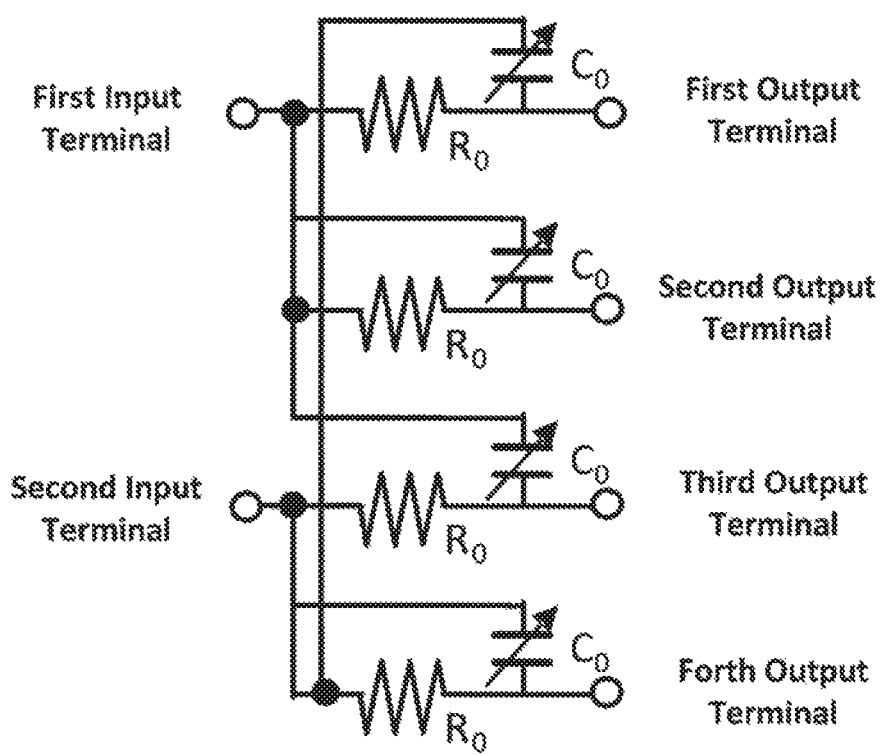
FIG. 1 is a circuit diagram for illustrating a problem of a related-art polyphase filter.
Figure 2:
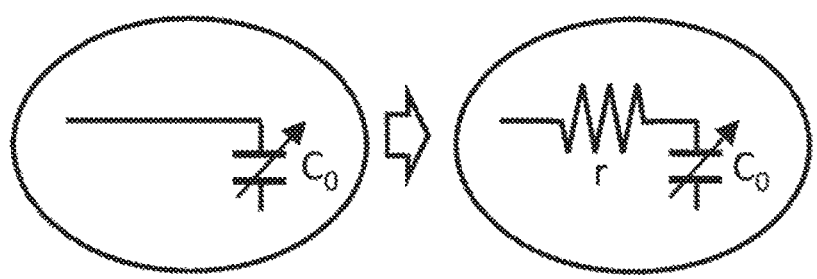
FIG. 2 is a partial circuit diagram for illustrating the problem of the related-art polyphase filter.
Figure 3:
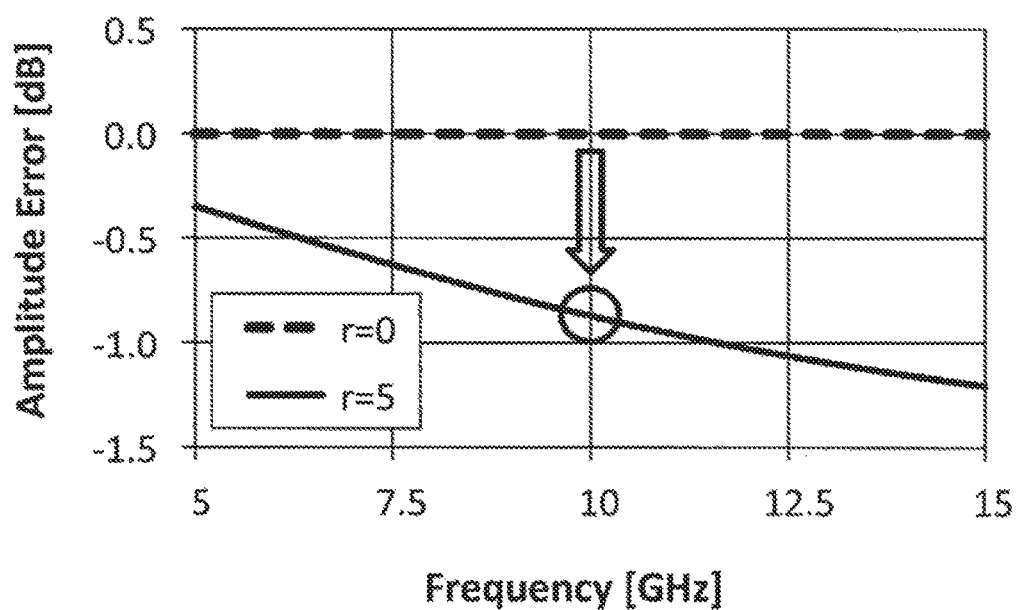
FIG. 3 is a graph for showing the problem of the related-art polyphase filter.

Before the embodiments of the present invention are described, problems inherent in the above-mentioned related-art polyphase filters are described first in detail with reference to FIG. 1 to FIG. 4. FIG. 1 to FIG. 3 relate to the polyphase filter of Non Patent Literature 1, and FIG. 4 relates to the polyphase filter of Patent Literature 1.

FIG. 1 is a circuit diagram for illustrating a problem of a related-art polyphase filter. In FIG. 1, the polyphase filter includes four fixed resistors $R_0$ and four varactors $C_0$.

Moreover, differential signals are input to a first input terminal and a second input terminal. Of orthogonal signals to be output, I differential signals are output from a first output terminal and a third output terminal, and Q differential signals are output from a second output terminal and a fourth output terminal. Depending on variations in process, temperature, and the like, a phase error may be generated between the orthogonal signals to be output.

The phase error may be corrected by adjusting capacitance values of the varactors $C_0$. However, the varactors $C_0$ have a characteristic of a reduced Q value especially in a high-frequency range. Therefore, in the high-frequency range, there apparently occurs a condition equivalent to a configuration in which a series resistor r is connected to the varactor $C_0$ as illustrated in FIG. 2. Therefore, there is a problem in that an amplitude error may be generated between the orthogonal signals to be output.

For example, when a Q value of the varactor $C_0$ is as low as 10 at 10 GHz, it is considered to be equivalent to a configuration in which the resistor r=5Ω is connected in series to the varactor $C_0$. Here, as shown in FIG. 3, when the phase error is set to 0 deg at 10 GHz, the I/Q orthogonal signals have an amplitude error of 0 dB when r=0Ω, but the I/Q orthogonal signals have an amplitude error of 0.9 dB when r=5Ω.

As described above, with the related-art polyphase filter having the single-stage configuration illustrated in FIG. 1, although the phase error is corrected by adjusting the capacitance values of the varactors $C_0$ while fixing resistance values, there is a problem in that the amplitude error cannot be corrected.

Figure 4:
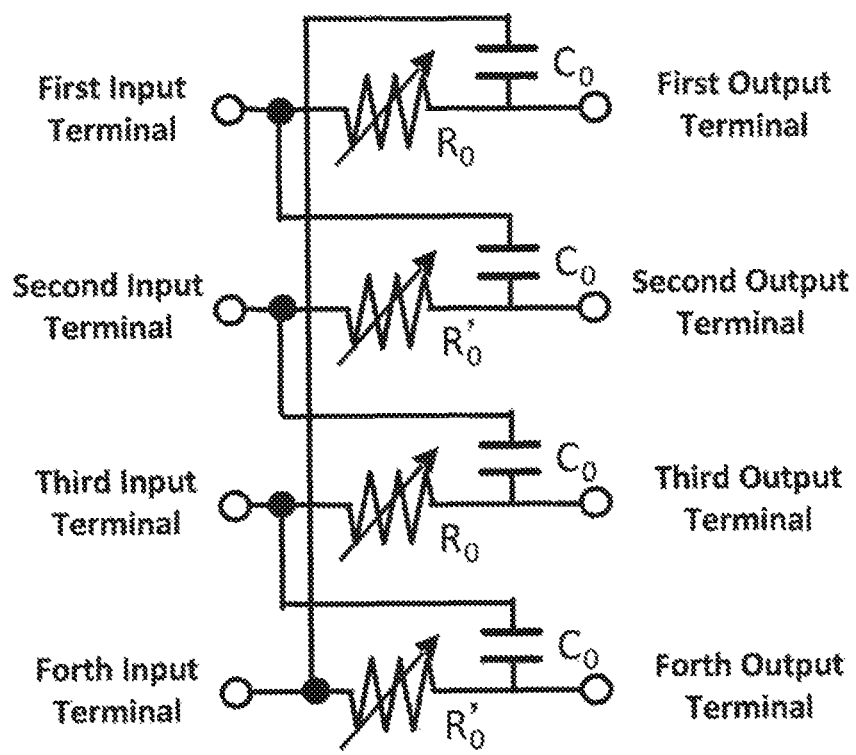
FIG. 4 is a circuit diagram for illustrating a problem of another related-art polyphase filter.

FIG. 4 is a circuit diagram for illustrating a problem of a related-art polyphase filter. In FIG. 4, the polyphase filter includes two variable resistors $R_0$, two variable resistors $R'_0$, and four fixed capacitors $C_0$.

Here, a case is assumed in which differential input signals to a second input terminal and a fourth input terminal have amplitudes that are (1+ε) times larger than amplitudes of differential input signals to a first input terminal and a third input terminal, where ε represents an amplitude error, and in which a phase error therebetween is 90 degrees.

The amplitude error can be corrected by setting resistance values of the variable resistors $R_0$ to one over (1+ε) times the resistance values in a case where there is no amplitude error, and setting resistance values of the variable resistors $R'_0$ to (1+ε) times the resistance values in the case where there is no amplitude error without changing the fixed capacitors $C_0$.

The above-mentioned control can be performed when the following expressions are satisfied: $\omega_0 C_0 R_0 = 1/(1+\varepsilon)$ and $\omega_0 C_0 R'_0 = 1+\varepsilon$, where $\omega_0$ represents an angular frequency of an IF signal, and hence the control cannot be performed unless the capacitors $C_0$ or the resistors $R_0$ are fixed.

As described above, with the related-art polyphase filter having the single-stage configuration illustrated in FIG. 4, only the amplitude error is corrected by adjusting the resistance values of the variable resistors while fixing the capacitance values, and there is a problem in that the phase error cannot be corrected.

Moreover, it can be considered to combine the related-art polyphase filter illustrated in FIG. 1 and the related-art polyphase filter illustrated in FIG. 4 to reduce the amplitude error and the phase error to 0, to thereby achieve amplitude matching and phase matching. However, the polyphase filter has a two-stage configuration, and there is a problem in that a low insertion loss cannot be achieved.

In view of the above-mentioned problems, in the following embodiments, a description is given of a polyphase filter capable of achieving amplitude matching and phase matching while achieving the low insertion loss with a single-stage configuration, and a filter circuit using the polyphase filter.

Embodiment 1

Figure 5:
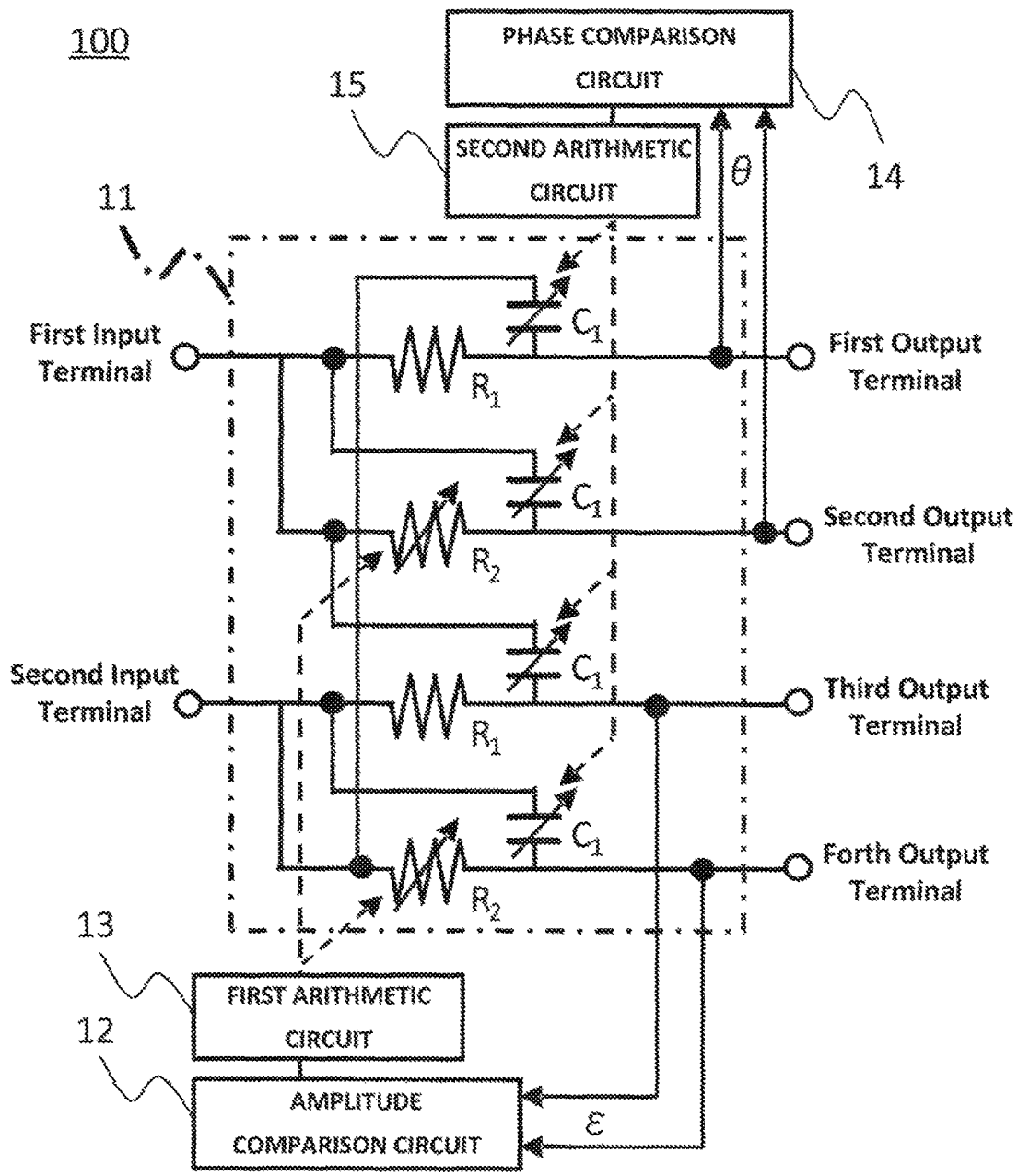
FIG. 5 is a circuit diagram for illustrating a filter circuit using a polyphase filter according to Embodiment 1 of the present invention.

FIG. 5 is a circuit diagram for illustrating a filter circuit using a polyphase filter according to Embodiment 1 of the present invention. In FIG. 5, a filter circuit 100 includes a polyphase filter 11, an amplitude comparison circuit 12, a first arithmetic circuit 13, a phase comparison circuit 14, and a second arithmetic circuit 15.

The polyphase filter 11 includes two fixed resistors $R_1$: a first fixed resistor and a second fixed resistor, two variable resistors $R_2$: a first variable resistor and a second variable resistor, and four variable capacitors $C_1$: a first variable capacitor, a second variable capacitor, a third variable capacitor, and a fourth variable capacitor.

Moreover, the first fixed resistor $R_1$ has one end connected to a first input terminal, and another end connected to a first output terminal. The first variable resistor $R_2$ has one end connected to the first input terminal, and another end connected to a second output terminal. The second fixed resistor $R_1$ has one end connected to a second input terminal, and another end connected to a third output terminal. The second variable resistor $R_2$ has one end connected to the second input terminal, and another end connected to a fourth output terminal.

Moreover, the first variable capacitor $C_1$ has one end connected to the second input terminal, and another end connected to the first output terminal. The second variable capacitor $C_1$ has one end connected to the first input terminal, and another end connected to the second output terminal. The third variable capacitor $C_1$ has one end connected to the first input terminal, and another end connected to the third output terminal. The fourth variable capacitor $C_1$ has one end connected to the second input terminal, and another end connected to the fourth output terminal.

Here, the first variable resistor $R_2$ and the second variable resistor $R_2$ have resistance values that are equal to each other, and the resistance values are set so as to correct the amplitude error between orthogonal signals of outputs of the first output terminal to the fourth output terminal. Moreover, the first variable capacitor $C_1$, the second variable capacitor $C_1$, the third variable capacitor $C_1$, and the fourth variable capacitor $C_1$ have capacitance values that are equal to one another, and the capacitance values are set so as to correct the phase error between the orthogonal signals of the outputs of the first output terminal to the fourth output terminal. As a result, the polyphase filter 11 forms an amplitude phase matching type polyphase filter.

The amplitude comparison circuit 12 receives, as inputs, orthogonal signals output from the third output terminal and the fourth output terminal, and outputs a signal indicating a comparison result to the first arithmetic circuit 13. The first arithmetic circuit 13 receives, as an input, the signal from the amplitude comparison circuit 12, and outputs control signals to the first variable resistor $R_2$ and the second variable resistor $R_2$.

The phase comparison circuit 14 receives, as inputs, orthogonal signals output from the first output terminal and the second output terminal, and outputs a signal indicating a comparison result to the second arithmetic circuit 15. The second arithmetic circuit 15 receives, as an input, the signal from the phase comparison circuit 14, and outputs control signals to the first variable capacitor $C_1$, the second variable capacitor $C_1$, the third variable capacitor $C_1$, and the fourth variable capacitor $C_1$.

Now, operation of the filter circuit 100 having the above-mentioned configuration is described.

The amplitude comparison circuit 12 detects the amplitude error ε based on the orthogonal signals output from the third output terminal and the fourth output terminal. Here, the amplitude error ε is a value that varies dynamically due to a variation in input signal, a variation in temperature, a variation in process, and other factors, and ε=0 when ideal differential signals are input to the input terminals.

The first arithmetic circuit 13 optimizes the first variable resistor $R_2$ and the second variable resistor $R_2$ using the amplitude error ε detected by the amplitude comparison circuit 12. At this time, when it is assumed that the variable capacitors $C_1$ have a low Q value, and that there occurs a condition equivalent to a condition in which the series resistor r is connected, a relationship of the following expression (1) is established between the amplitude error ε and the variable resistors $R_2$.

$$\varepsilon = \sqrt{[\{(r/R_1)^2 + (R_2/r)^2\}/2] - 1} \tag{1}$$

In the expression (1), in a range in which the amplitude error ε is close to 0, the amplitude error ε exhibits a monotonously increasing characteristic with respect to the variable resistors $R_2$. In other words, the first arithmetic circuit 13 can cause values of the variable resistors $R_2$ to converge by repeatedly controlling the values such that the amplitude error ε becomes 0.

The phase comparison circuit 14 detects a phase error θ based on the orthogonal signals output from the first output terminal and the second output terminal. Here, the phase error θ is a value that varies dynamically due to a variation in input signal, a variation in temperature, a variation in process, and other factors, and θ=0 when ideal differential signals are input to the input terminals.

The second arithmetic circuit 15 optimizes the first variable capacitor $C_1$, the second variable capacitor $C_1$, the third variable capacitor $C_1$, and the fourth variable capacitor $C_1$ using the phase error θ detected by the phase comparison circuit 14. At this time, a relationship of the following expression (2) is established between the phase error θ and the variable capacitors $C_1$.

$$\tan\theta = \{(\omega C_1)^2 \times R_1 R_2 + 1\} / \{(\omega C_1)^2 \times R_1 R_2 - 1\} \tag{2}$$

In other words, the second arithmetic circuit 15 can cause values of the variable capacitors $C_1$ to converge by repeatedly controlling the values such that the phase error θ becomes 0. Here, as shown in the expression (1), the amplitude error ε does not depend on the variable capacitors $C_1$, and hence controlling the variable capacitors $C_1$ such that θ=0 does not affect the amplitude error ε.

Those procedures of optimizing the variable resistors $R_2$ and the variable capacitors $C_1$ are performed depending on the amplitude error ε that varies dynamically, and hence the variable resistors $R_2$ and the variable capacitors $C_1$ also vary dynamically.

Figure 6:
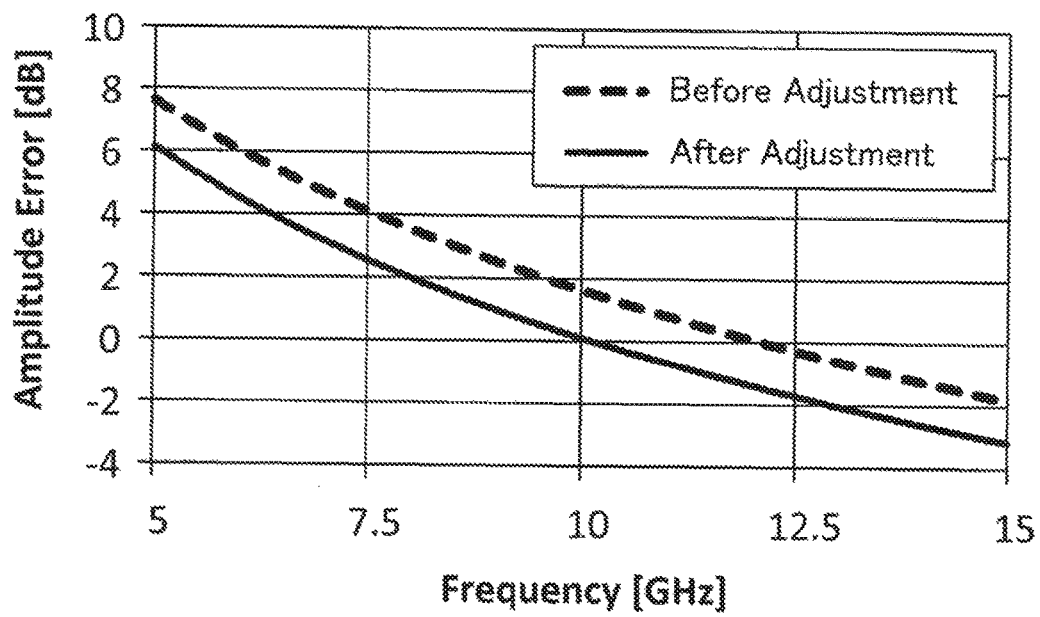
FIG. 6 is a graph for showing an effect of the filter circuit using the polyphase filter according to Embodiment 1 of the present invention.
Figure 7:
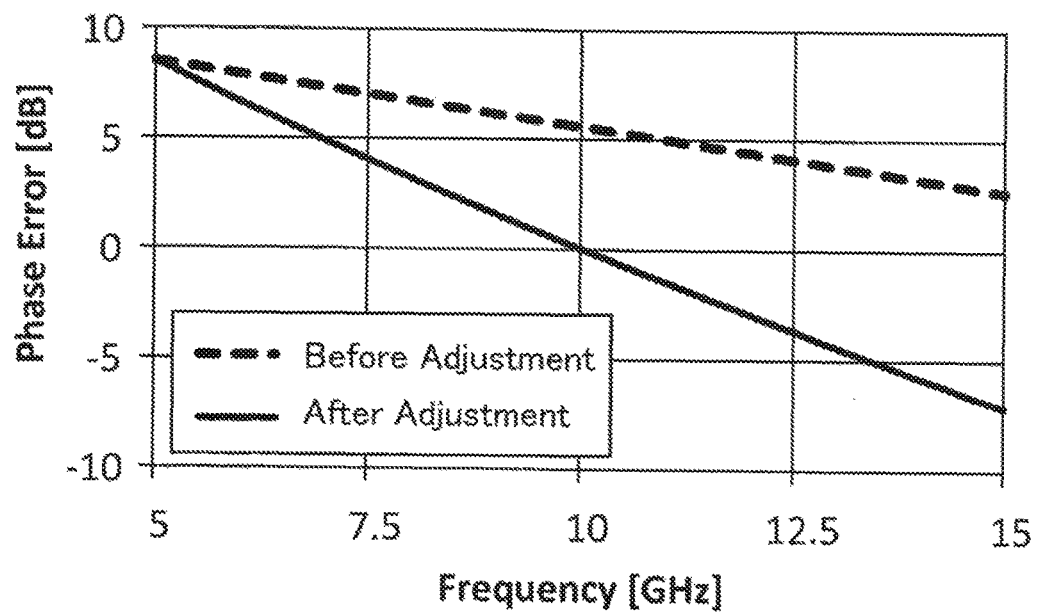
FIG. 7 is a graph for showing another effect of the filter circuit using the polyphase filter according to Embodiment 1 of the present invention.

FIG. 6 and FIG. 7 are graphs for showing effects of the filter circuit using the polyphase filter according to Embodiment 1 of the present invention. An amplitude error characteristic is shown in FIG. 6, and a phase error characteristic is shown in FIG. 7.

In FIG. 6 and FIG. 7, it is assumed, for example, that the following characteristics: an amplitude error of 1.9 dB and a phase error of 5.6 deg are obtained at 10 GHz for an element constant (before adjustment). Here, when the variable resistors $R_2$ and the variable capacitors $C_1$ are controlled by the above-mentioned method, as shown in FIG. 6 and FIG. 7, the following correction results was able to be obtained: the amplitude error of 0 dB, and the phase error of 0 deg (phase error of 90 deg).

As described above, the polyphase filter 11 achieves amplitude matching of I/Q orthogonal signals by comparing the amplitude error between the orthogonal signals at the output terminals in the amplitude comparison circuit 12, and adjusting the variable resistors $R_2$ so as to correct the amplitude error, and achieves phase matching of the I/Q orthogonal signals by comparing the phase error between the orthogonal signals at the output terminals in the phase comparison circuit 14, and adjusting the variable capacitors $C_1$ so as to correct the phase error. Moreover, amplitude matching and phase matching can be achieved at the same time by performing the control through the above-mentioned procedure.

As described above, according to Embodiment 1, in the polyphase filter, the first variable resistor and the second variable resistor have the resistance values that are equal to each other, and the resistance values are set so as to correct the amplitude error between the orthogonal signals of the outputs of the first output terminal to the fourth output terminal. Moreover, the first variable capacitor, the second variable capacitor, the third variable capacitor, and the fourth variable capacitor have the capacitance values that are equal to one another, and the capacitance values are set so as to correct the phase error between the orthogonal signals of the outputs of the first output terminal to the fourth output terminal.

Therefore, amplitude matching and phase matching can be achieved while achieving the low insertion loss with the single-stage configuration.

Embodiment 2

Figure 8:
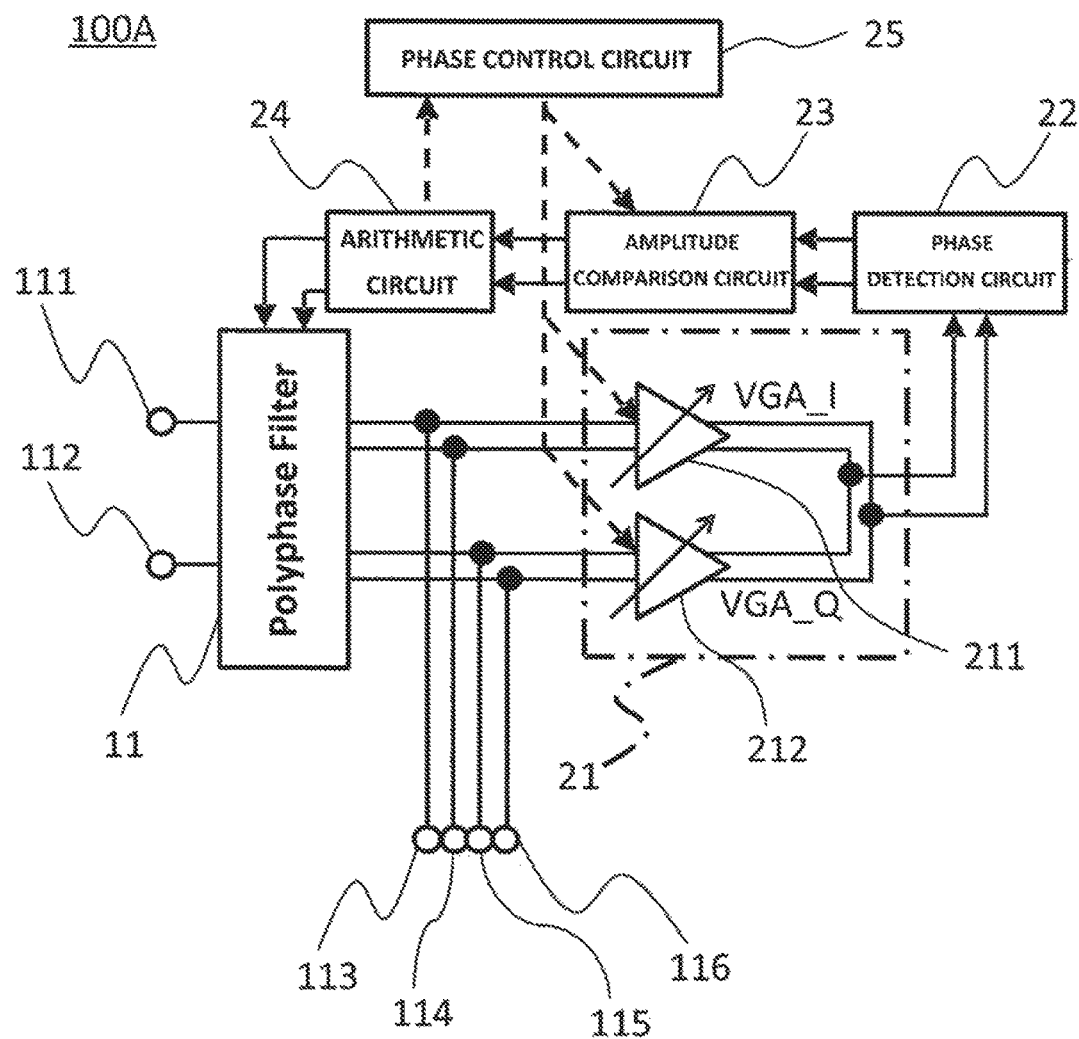
FIG. 8 is a circuit diagram for illustrating a filter circuit using a polyphase filter according to Embodiment 2 of the present invention.

FIG. 8 is a circuit diagram for illustrating a filter circuit using a polyphase filter according to Embodiment 2 of the present invention. In FIG. 8, a filter circuit 100A includes a polyphase filter 11, a vector sum phase shifter 21, a phase detection circuit 22, a phase comparison circuit 23, an arithmetic circuit 24, and a phase control circuit 25.

The polyphase filter 11 is an amplitude phase matching type polyphase filter having the same configuration as that described above in Embodiment 1, and has an input side connected to input terminals 111 and 112, and an output side connected to output terminals 113 to 116. Four orthogonal differential signals are output from the output terminals 113 to 116, and are branched to be input to the vector sum phase shifter 21.

The vector sum phase shifter 21 includes a VGA_I 211 and a VGA_Q 212. The term "VGA" stands for "variable gain amplifier". The VGA_211 and the VGA_Q 212 receive, as inputs, I/Q orthogonal differential signals from the polyphase filter 11 and control signals from the phase control circuit 25, synthesize the orthogonal signals, and output the synthesized signals to the phase detection circuit 22.

The phase detection circuit 22 has an input side connected to an output side of the vector sum phase shifter 21, and the phase detection circuit 22 has an output side connected to an input side of the phase comparison circuit 23. Moreover, the phase comparison circuit 23 has the input side connected to the output side of the phase detection circuit 22, and the phase comparison circuit 23 has an output side connected to an input side of the arithmetic circuit 24.

The arithmetic circuit 24 has the input side connected to the output side of the phase comparison circuit 23, and the arithmetic circuit 24 has an output side connected to the polyphase filter 11. Moreover, the phase control circuit 25 has an input side connected to the output side of the arithmetic circuit 24, and the phase control circuit 25 has an output side connected to the phase comparison circuit 23, the VGA_I 211, and the VGA_Q 212.

Here, the arithmetic circuit 24 receives, as inputs, signals from the phase comparison circuit 23, outputs control signals to the polyphase filter 11, and also outputs a control signal to the phase control circuit 25. Moreover, the phase control circuit 25 outputs control signals not only to the VGA_I 211 and the VGA_Q 212, but also to the phase comparison circuit 23.

Now, operation of the filter circuit 100A having the above-mentioned configuration is described.

The polyphase filter 11 converts differential signals, which are input from the input terminals 111 and 112, into the I/Q orthogonal differential signals. Here, it is assumed that an amplitude error ε and a phase error θ are generated due to an element variation of the polyphase filter 11.

The amplitude error ε and the phase error θ are values that vary dynamically due to a variation in input signal, a variation in temperature, a variation in process, and other factors, and ε=0 and θ=0 when ideal differential signals are input to the input terminals. Moreover, the amplitude error ε and the phase error θ are corrected by a loop formed of the vector sum phase shifter 21, the arithmetic circuit 24, and other such components, which is to be described later. The specific correction procedure proceeds as follows.

First, the arithmetic circuit 24 sweeps a phase shift amount of the vector sum phase shifter 21 at a plurality of points of from 0° to 360°. Moreover, the vector sum phase shifter 21 is operated in accordance with phase set values for the VGAs, which are given through the phase control circuit 25, to thereby determine phases of outputs. However, the amplitude error ε and the phase error θ are generated in the polyphase filter 11 as described above, and hence the phases of the output signals include errors from the phase set values.

Subsequently, the amplitude error ε and the phase error θ are detected by the phase detection circuit 22 and the phase comparison circuit 23. Here, a comparison result of the phase comparison circuit 23 may be input to the arithmetic circuit 24 to determine error characteristics of the vector sum phase shifter 21, and the amplitude error ε and the phase error θ of the polyphase filter 11 can be calculated through inverse operation based on the error characteristics.

Next, using the calculated amplitude error ε and the calculated phase error θ, values of the variable resistors $R_2$ and the variable capacitors $C_1$ of the polyphase filter 11 are optimized by the method described above in Embodiment 1. As a result, the amplitude error and the phase error of the polyphase filter 11 can be corrected.

Those procedures of optimizing the variable resistors $R_2$ and the variable capacitors $C_1$ are performed depending on the amplitude error ε that varies dynamically, and hence the variable resistors $R_2$ and the variable capacitors $C_1$ also vary dynamically.

As described above, according to Embodiment 2, in the polyphase filter, the first variable resistor and the second variable resistor have the resistance values that are equal to each other, and the resistance values are set so as to correct the amplitude error between the orthogonal signals of the outputs of the first output terminal to the fourth output terminal. Moreover, the first variable capacitor, the second variable capacitor, the third variable capacitor, and the fourth variable capacitor have the capacitance values that are equal to one another, and the capacitance values are set so as to correct the phase error between the orthogonal signals of the outputs of the first output terminal to the fourth output terminal.

Therefore, amplitude matching and phase matching can be achieved while achieving the low insertion loss with the single-stage configuration.

The invention claimed is:
1. A polyphase filter, comprising:
   a first fixed resistor, which has one end connected to a first input terminal, and another end connected to a first output terminal;
   a first variable resistor, which has one end connected to the first input terminal, and another end connected to a second output terminal;
   a second fixed resistor, which has one end connected to a second input terminal, and another end connected to a third output terminal;
   a second variable resistor, which has one end connected to the second input terminal, and another end connected to a fourth output terminal;

a first variable capacitor, which has one end connected to the second input terminal, and another end connected to the first output terminal;

a second variable capacitor, which has one end connected to the first input terminal, and another end connected to the second output terminal;

a third variable capacitor, which has one end connected to the first input terminal, and another end connected to the third output terminal; and a fourth variable capacitor, which has one end connected to the second input terminal, and another end connected to the fourth output terminal, the first variable resistor and the second variable resistor having resistance values that are equal to each other, the resistance values being set so as to correct an amplitude error between orthogonal signals of outputs of the first output terminal to the fourth output terminal, the first variable capacitor, the second variable capacitor, the third variable capacitor, and the fourth variable capacitor having capacitance values that are equal to one another, the capacitance values being set so as to correct a phase error between the orthogonal signals of the outputs of the first output terminal to the fourth output terminal.

2. A filter circuit, which uses the polyphase filter of claim 1, the filter circuit comprising:

an amplitude comparison circuit, which is configured to compare amplitudes between the orthogonal signals of the outputs of the first output terminal to the fourth output terminal to detect an amplitude error;

a first arithmetic circuit, which is configured to calculate the resistance values of the first variable resistor and the second variable resistor so as to correct the amplitude error;

an phase comparison circuit, which is configured to compare phases between the orthogonal signals of the outputs of the first output terminal to the fourth output terminal to detect a phase error; and a second arithmetic circuit, which is configured to calculate, after the resistance values of the first variable resistor and the second variable resistor are set, the capacitance values of the first variable capacitor, the second variable capacitor, the third variable capacitor, and the fourth variable capacitor so as to correct the phase error.

3. A filter circuit, which uses the polyphase filter of claim 1, the filter circuit comprising:

a vector sum phase shifter, to which the outputs of the first output terminal to the fourth output terminal are to be input, and which is configured to synthesize orthogonal signals to output the synthesized signals;

a phase detection circuit, which is configured to detect phases of the synthesized signals from the vector sum phase shifter;

a phase control circuit, which is configured to output a control signal to the vector sum phase shifter based on an input phase set value;

a phase comparison circuit, which is configured to compare an output value from the phase detection circuit to the phase set value, which is set in the vector sum phase shifter; and an arithmetic circuit, which is configured to calculate an amplitude error and a phase error of the polyphase filter based on a comparison result of the phase comparison circuit, and to calculate the resistance values of the first variable resistor and the second variable resistor, and the capacitance values of the first variable capacitor, the second variable capacitor, the third variable capacitor, and the fourth variable capacitor using the calculated amplitude error and the calculated phase error.

* * * * *